United States Patent [19]
Ogawa et al.

[11] Patent Number: 6,004,860
[45] Date of Patent: Dec. 21, 1999

[54] SOI SUBSTRATE AND A METHOD FOR FABRICATING THE SAME

[75] Inventors: Tadashi Ogawa, Miyazaki; Akihiro Ishii, Miyazaki-gun; Yuichi Nakayoshi, Kitamorokata-gun, all of Japan

[73] Assignee: Komatsu Electronic Metals Co., Ltd., Kanagawa, Japan

[21] Appl. No.: 08/705,956

[22] Filed: Aug. 30, 1996

[51] Int. Cl.$^6$ .................................................. H01L 21/76
[52] U.S. Cl. ........................ 438/406; 438/404; 438/455; 438/457; 148/DIG. 12; 148/DIG. 135
[58] Field of Search .................................... 438/404, 406, 438/455, 457, 459, 691, 692; 148/DIG. 12, DIG. 135

[56] References Cited

U.S. PATENT DOCUMENTS

| | | | |
|---|---|---|---|
| 4,017,341 | 4/1977 | Suzuki et al. ............................ | 438/406 |
| 5,071,785 | 12/1991 | Nakazato et al. ....................... | 438/457 |
| 5,258,323 | 11/1993 | Sarma et al. ........................... | 148/DIG. 12 |
| 5,308,776 | 5/1994 | Gotou ...................................... | 438/406 |
| 5,395,788 | 3/1995 | Abe et al. ............................... | 148/DIG. 12 |
| 5,668,045 | 9/1997 | Golland et al. ......................... | 148/DIG. 12 |

FOREIGN PATENT DOCUMENTS 176993   6/1994   Japan ............................. 148/DIG. 12

*Primary Examiner*—Tuan H. Nguyen
*Attorney, Agent, or Firm*—Welsh & Katz, Ltd.

[57] ABSTRACT

An SOI substrate and a method for fabricating the same are provided to sharpen the departing angle at the circumference of the active substrate, and provide the active substrate with a uniform thickness. An attached wafer of the present invention is formed by processing the upper side of the base substrate so that its thickness increases from the center to the circumference, and attaching the active substrate to the processed side of the base substrate. The unattached portion of the attached wafer is removed. Then mirror processing is performed to provide the active substrate with a substantially uniform thickness along the processed side of the base substrate.

7 Claims, 5 Drawing Sheets

SOI SUBSTRATE AND A METHOD FOR FABRICATING THE SAME

BACKGROUND OF THE INVENTION

1. Field of the invention

The present invention relates to an SOI (silicon on insulator) substrate and a method for fabricating the same, which is made by attaching an active substrate constituted by a second semiconductor wafer to a base substrate constituted by a first semiconductor wafer.

2. Description of prior art

A conventional SOI substrate is obtained by attaching an active substrate constituted by a second semiconductor wafer to a base substrate constituted by a first semiconductor wafer, grinding or etching the unattached portion, then flat grinding the active substrate and processing the active substrate by polishing its upper portion to thin out the active substrate.

Accordingly, the flatness of an SOI substrate depends on the flatness of a base substrate semiconductor wafer. A semiconductor wafer with a high degree of flatness is hence requested to serve as the base substrate of an SOI substrate.

However, no matter what the flatness of a semiconductor wafer for the base substrate is, an SOI substrate as shown in FIG. 5a has to be processed by polishing the upper portion of the active substrate 8, and form a descending portion 8a as shown in FIG. 5b. As shown in FIG. 6, since the descending portion is provided with a small departing angle α, the device engineering suffers from poor yield. The departing angle α is an angle between peripheral side surface of the active surface and the top surface of the active surface.

SUMMARY OF THE INVENTION

Accordingly, an object of the present invention is to provide an SOI substrate and a method for fabricating the same, which can make the departing angle acute, and form the active substrate with a uniform thickness.

The present invention is to provide an SOI substrate, which includes a base substrate, an insulator formed on the base substrate and an active substrate formed on the insulator, shaped in such a way that the upper surface of the active substrate is thick from the center thereof to the circumference, wherein the active substrate with a substantially uniform thickness is attached along the upper surface of the base substrate.

Moreover, the fabrication method for an SOI substrate involves processing the upper surface of a base substrate constituted by a first semiconductor wafer and making the thickness of the semiconductor wafer gradually increase from the center thereof to the circumference, then, the processed surface of the base substrate is attached to an active substrate constituted by a second semiconductor wafer to form an attached wafer.

Then the unattached portion of the attached wafer is removed.

Mirror processing is performed on the active substrate which has the unattached portion removed, thus forming a substantially uniform thickness along the processed surface of the base substrate.

BRIEF DESCRIPTION OF THE DRAWINGS

The following detailed description, given by way of example and not intended to limit the invention solely to the embodiments described herein, will best be understood in conjunction with the accompanying drawings in which.

DETAILED DESCRIPTION OF THE PREFERRED EMBODIMENTS

Figure 1A:
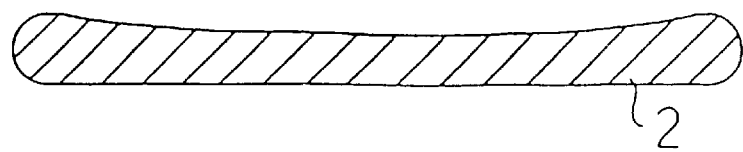
FIGS. 1a to 1e are diagrams illustrating the sectional side elevation of the SOI substrate in each step of the fabricating method according to the present invention.
Figure 1B:
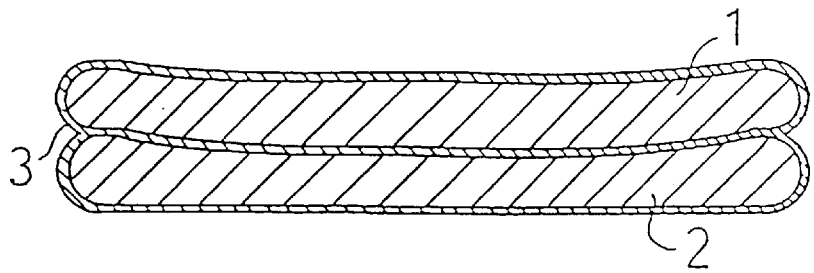
Figure 1C:
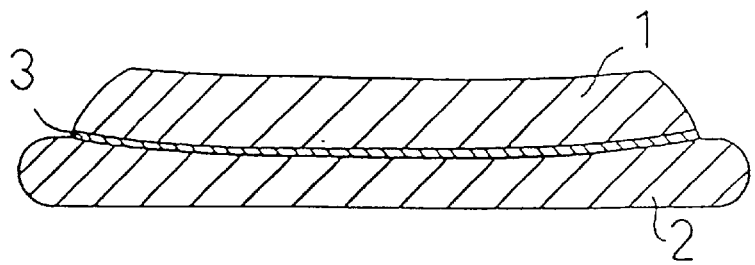
Figure 1D:
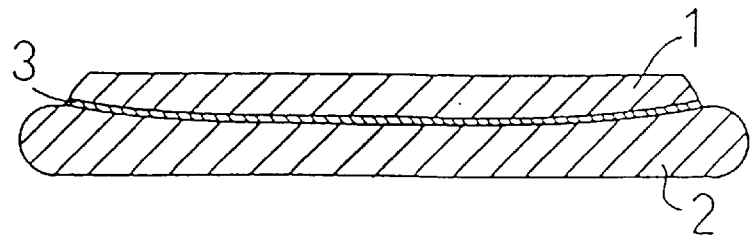
Figure 1E:
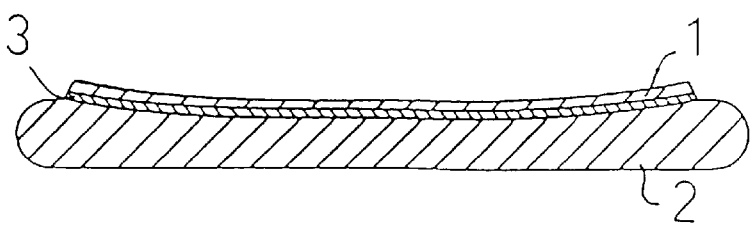

FIGS. 1a to 1e illustrate the sectional side elevation of the SOI substrate in each step of the fabricating method according to the present invention. One preferred embodiment of the SOI substrate is fabricated by the method including the following steps of:

(1) polishing a base substrate semiconductor wafer 2 so that the thickness of the semiconductor wafer gradually increases from a center thereof to circumference to form a concave surface (referring to FIG. 1a);

(2) forming an oxide film 3 on the surface of the base substrate 2, attaching an active substrate 1 to the concave surface, and also forming the oxide film 3 on the active substrate 1 (referring to FIG. 1b);

(3) removing an unattached portion formed on the circumference of the attached base substrate 2 and active substrate 1 by grinding and etching, then removing all the oxide film 3 except for that between the base substrate 2 and the active substrate 1 by etching (referring to FIG. 1c);

(4) flat grinding to thin the active substrate 1 (referring to FIG. 1d);

(5) polishing the active substrate 1 to form a substantially uniform thickness by the methods described later, and forming a concave shape from circumference to center along the processed surface of the base substrate 2. Thereafter, an SOI substrate can be obtained after cleaning the attachments (referring to FIG. 1e).

Figure 2:
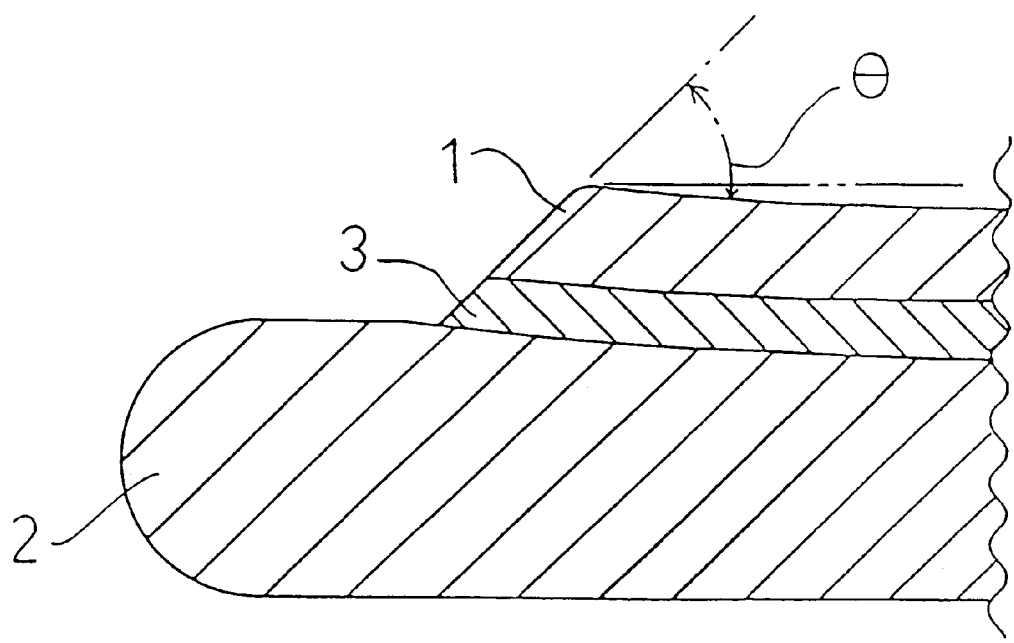
FIG. 2 is a diagram illustrating a partially enlarged section of the SOI substrate according to the present invention.
Figure 6:
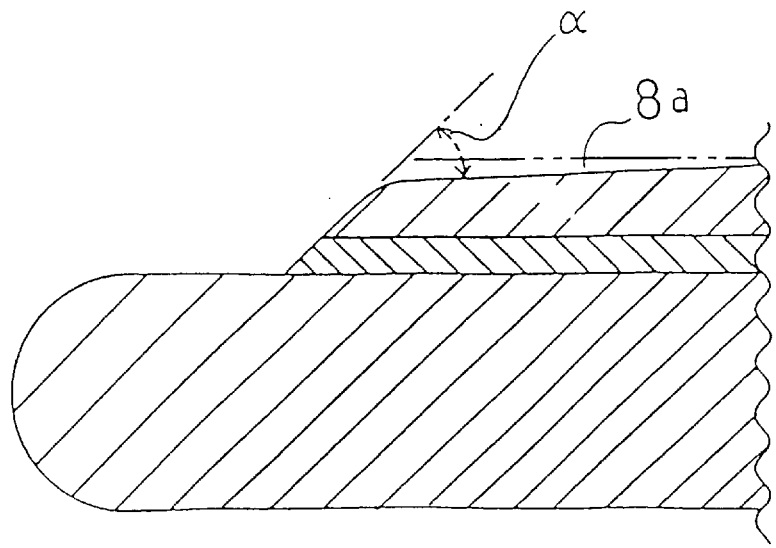
FIG. 6 is a diagram illustrating a partially enlarged section of a prior-art SOI substrate.

The SOI substrate produced by the above fabricating method will not reduce the departing angle α of the descending portion 8a as shown in FIG. 6. Moreover, as shown in FIG. 2, the departing angle α becomes more acute due to the concave. The yield checked by four points probe method is hence significantly raised.

Moreover, the concave formed on the SOI substrate is gradually inclined from the circumference to the center. The difference between the circumference and the center, i.e. the depth of the concave, which has to be removed while polishing is set to be 0.5 μm, therefore, there is no problem produced in device engineering. The departing angle at the circumference is more acute since the active substrate of the SOI substrate is not provided with a descending portion but has a uniform thickness, so that the yield-is raised.

Here, the processing method of forming a concave on the base substrate and the active substrate is described.

The processing method utilizes the polishing method of a polishing apparatus normally used for mirror polishing. Among such polishing methods, preferred methods for processing base substrate and active substrate involve attaching the semiconductor wafer to be polished to an attaching block, and the single wafer polishing method wherein the semiconductor wafer to be polished is attached to a top ring. The preferred method for processing the upper side of a base substrate uses a double-side polishing apparatus.

First, the polishing method wherein the semiconductor wafer to be polished is attached to an attaching block is attached is described.

Figure 3A:
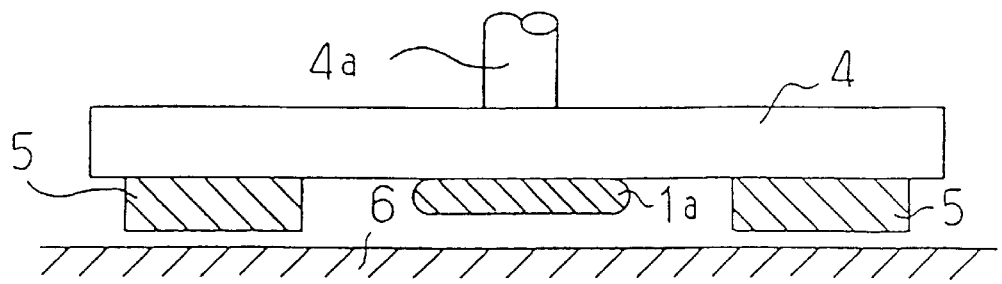
FIGS. 3a to 3d are diagrams illustrating the polishing method employed in the present invention.

Referring to FIG. 3a, a semiconductor wafer to be polished is attached to the center of a disk-shaped attaching block 4. Four dummies 5 for adjusting the polishing thickness are attached around the semiconductor wafer to the attaching block 4. The dummies 5 serve as stoppers for setting the processing thickness while polishing. Therefore, the thickness of each dummy is normally thinner than a semiconductor substrate. However, to process the semiconductor wafer and form one side of the semiconductor wafer with a concave, the thickness of each dummy 5 is set to be thicker than the semiconductor wafer.

Figure 3B:
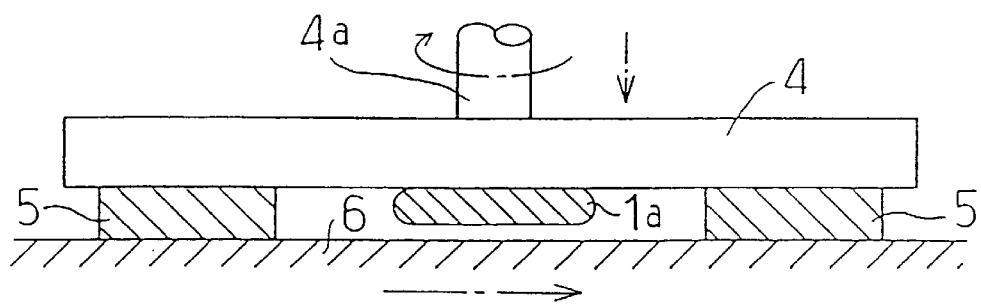

Referring to FIG. 3b, while rotating the rotating spindle 4a and rotating a mounting plate (not shown in the drawing) adhered with a cloth 6, the dummy 5 and the cloth 6 are contacted by bringing the attaching block 4 down.

Figure 3C:
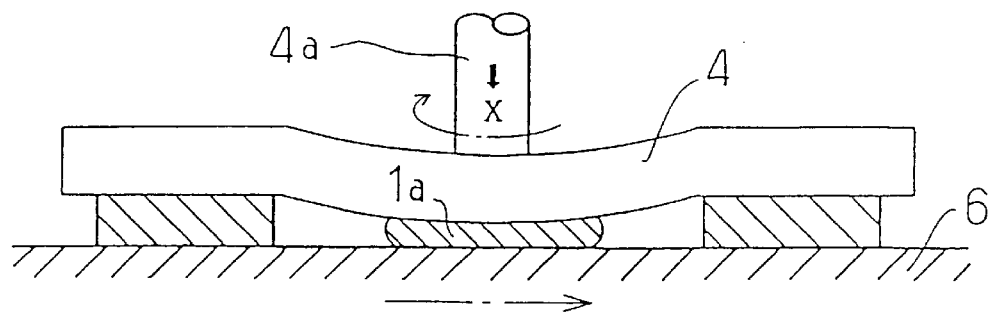

Referring to FIG. 3c, deflecting the attaching block 4 and pressing the semiconductor wafer 1a toward the cloth 6 by putting inner pressure X on the rotating spindle 4a, the semiconductor wafer 1a attached to the attaching block 4 is curved along the attaching block 4 while being polished.

Figure 3D:
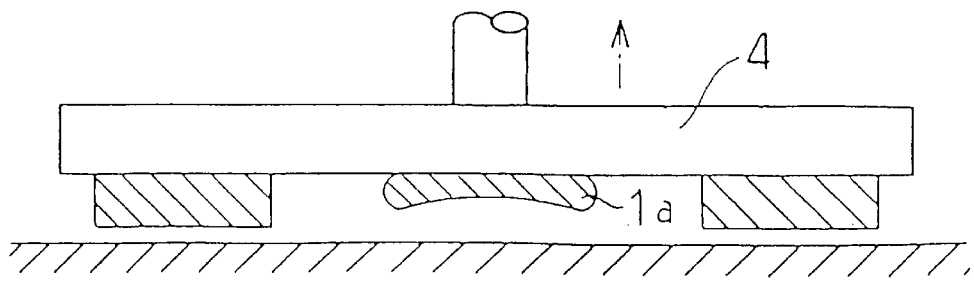

Finally, as shown in FIG. 3d, the attaching block 4 is raised to restore its original shape, and to restore the shape of the semiconductor wafer. The semiconductor wafer is formed with a concave shape after polishing, since the polished side thereof has been polished on the center more than on the circumference.

Next, the single wafer polishing method wherein the semiconductor wafer be polished is attached to a top ring is described.

Figure 4A:
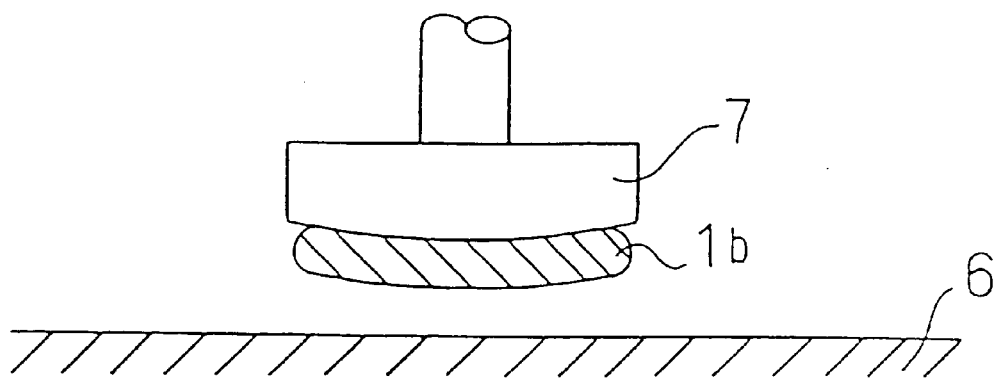
FIGS. 4a to 4c are diagrams illustrating another polishing method employed in the present invention.

The single wafer polishing method involves the steps of polishing a semiconductor wafer after attaching the semiconductor wafer to a top ring. As shown in FIG. 4a, in order to process the semiconductor wafer 1b and provide one side of the semiconductor wafer 1b with a concave surface, the attaching surface of the top ring 7 has to be previously formed as a convex shape corresponding to the desired concave shape to be formed. Therefore, the semiconductor wafer 1b is attached to the convex side of the top ring 7 and assumes a curved shape.

Figure 4B:
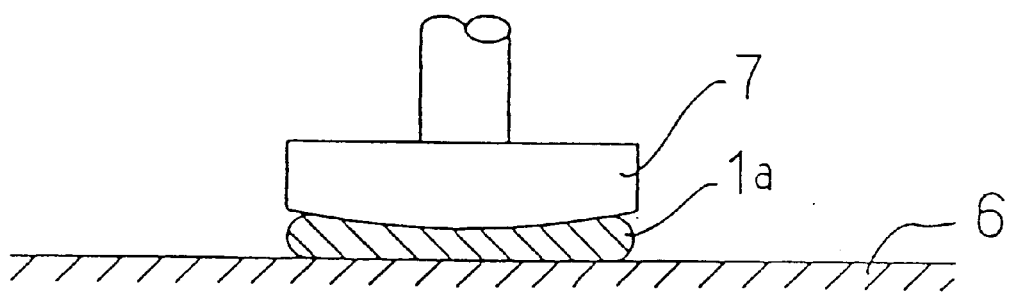

Referring to FIG. 4b, the top ring 7 is rotated and pressed on the cloth 6 to polish the semiconductor wafer, so that the center of the semiconductor wafer has been polished more than the circumference thereof.

Figure 4C:
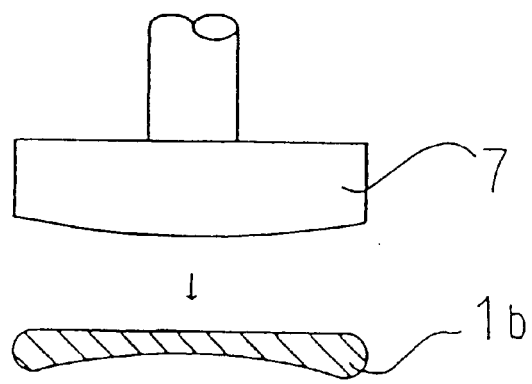
Figure 5A:
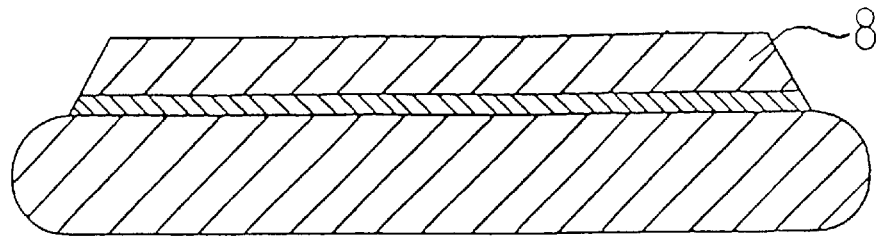
FIGS. 5a and 5b are diagrams illustrating the sectional side elevation of a prior-art SOI substrate.
Figure 5B:
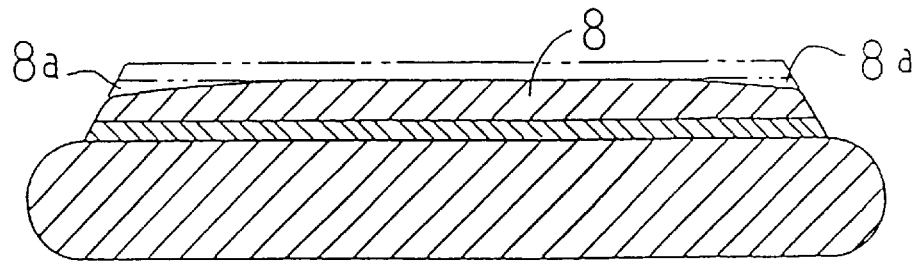

Referring to FIG. 4c, the semiconductor wafer 1b is taken off from the top ring after polishing, the polished side then has a concave shape once the semiconductor wafer is restored to its original flat shape.

The polished method using a double-side polishing apparatus is described below.

While polishing the semiconductor wafer, the polishing speed depends on the conditions such as the temperature of the polishing side, the substance of the rubbing surface of the polishing apparatus, and the pressure. Among such conditions, the temperature of the polishing side can be controlled in a certain range by varying the rotating velocity of the mounting plate while the other conditions are constant.

Moreover, comparing the abrasive grain and the flow velocity of the polishing water at the center with that at the circumference on the polishing side of each single wafer, the flow velocity at the circumference is faster than at the center. This causes the center to release heat more slowly. In other words, the temperature at the center is intended to gradually rise. The center having a higher temperature is polished in a faster speed than the circumference. The variation in polishing speed according to the local temperature difference only occurs above a certain temperature. If the temperature of the polishing side is below the certain temperature, then a descending portion will form on the circumference.

Double-side polishing engineering which causes the variation of polishing speed by temperature difference is used to polish a semiconductor wafer into a concave shape. That is, the rotation speed is a preset value to polish the double side of the semiconductor wafer to a uniform flat shape while performing double-sided polishing. If the rotation speed of the upper lapping plate or lower lapping plate is larger than the preset value, the temperature of the polishing side rises. Then the polishing side contacting the cloth of the lapping plate which has its rotation speed raised is formed in a concave shape while being polished.

For example, while polishing a wafer 1 having a diameter of 8 inches, the rotation speed for double side polishing is set to 40 rpm to form two flat sides. When the rotation speed is raised by 5 rpm, the thickness difference resulted by polishing the center and the circumference, i.e. the depth of the concave, can be 0.25~0.3 $\mu$m.

Moreover, there are many other processing methods for forming a concave on one side of a semiconductor wafer. But when fabricating an SOI substrate according to the present invention, PACE processing and precision grinding, which can precisely process the processed side, are preferred.

The departing angle is not reduced by forming the descending portion due to the constitution of the present invention. And the departing angle is more acute due to forming with a concave, so that the present invention results in an excellent increase in yield.

Further, the SOI substrate formed with a concave is provided with an active substrate having no descending portion but a uniform thickness. The present invention therefore provides an excellent increase in yield.

What is claimed is:

1. An SOI substrate comprises:

a base substrate;

an insulator formed on the base substrate;

and an active substrate formed on the insulator;

wherein the base substrate has a thickness gradually increasing from the center thereof to the circumference so that a top surface of the base substrate is in a concave shape, and the active substrate having a substantially uniform thickness is attached to the top surface of the base substrate along the surface.

2. A method for fabricating an SOI substrate, comprising the steps of:

(i) processing a base substrate constituted by a first semiconductor wafer so that the thickness of the first semiconductor wafer gradually increases from the center thereof to the circumference thereby a top surface of the base substrate is in a concave shape on one surface;

(ii) forming an bonded-wafer by bonding an active substrate constituted by a second semiconductor wafer to the top surface of the base substrate;

(iii) removing an unattached portion of the bonded-wafer; and (iv) performing mirror processing on a surface of the active substrate which has the unattached portion removed, to form the active surface it with a substantially uniform thickness along the top surface of the base substrate being processed.

3. A method for fabricating an SOI substrate as claimed in claim 2, wherein the step of processing the first semiconductor wafer so that the first semiconductor wafer has the thickness being gradually increase from a center thereof to the circumference comprises polishing the top surface of the first semiconductor wafer while pressurizing a disk-shaped attaching block attached by the first semiconductor wafer on the center thereof and attached a dummy wafer around the first semiconductor wafer forward of rotating plate, the dummy wafer being thicker than the first semiconductor wafer base.

4. A method for fabricating an SOI substrate as claimed in claim 2, wherein the step of processing the first semiconductor wafer so that the first semiconductor wafer has the thickness which gradually increases from the center thereof to the circumference comprises polishing one by one while attaching a surface of a top ring with a convex surface so that the base substrate can be formed along the shape of the surface of the top ring.

5. A method for fabricating an SOI substrate as claimed in claim 2, wherein the step of processing the first semiconductor wafer so that the first semiconductor wafer as to have the thickness being gradually increase from the center thereof to the circumference is polishing double side of the first semiconductor wafer by attaching double side thereof to an upper lapping disk and an lower lapping disk while changing the rotation velocity of one of the upper lapping disk and the lower lapping disc.

6. A method for fabricating an SOI substrate as claimed in claim 2, wherein the step of performing mirror processing on the active substrate to form the active substrate with a substantially uniform thickness along the surface of the base substrate being processed comprises polishing the surface of the second semiconductor wafer while pressurizing a disk-shaped attaching block attached by the bonded-wafer on the center thereof and attached to a dummy wafer around the bonded-wafer forward of a rotating plate, the dummy wafer being thicker than the bonded-wafer forward a rotating plate base.

7. A method for fabricating an SOI substrate as claimed in claim 2, wherein the step of performing mirror processing on the active layer to form the active layer with a substantially uniform thickness along the surface of the base substrate being processed comprises polishing one by one while attaching surface of a top ring with a convex surface so that the base substrate can be formed along the shape of the surface of the top ring.

\* \* \* \* \*